US010833682B1

(12) United States Patent
Monk et al.

(10) Patent No.: US 10,833,682 B1
(45) Date of Patent: Nov. 10, 2020

(54) CALIBRATION OF AN INTERPOLATIVE DIVIDER USING A VIRTUAL PHASE-LOCKED LOOP

(71) Applicant: Silicon Laboratories Inc., Austin, TX (US)

(72) Inventors: Timothy A. Monk, Hudson, NH (US); Douglas F. Pastorello, Hudson, NH (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/582,266

(22) Filed: Sep. 25, 2019

(51) Int. Cl.
*H03L 7/06* (2006.01)
*H03L 7/081* (2006.01)
*H03L 7/197* (2006.01)
*H03L 7/093* (2006.01)

(52) U.S. Cl.
CPC .............. *H03L 7/081* (2013.01); *H03L 7/093* (2013.01); *H03L 7/197* (2013.01)

(58) Field of Classification Search
CPC ......... H03L 7/0891; H03L 7/18; H03L 7/093; H03L 7/087; H03L 7/10
USPC ........................................................ 327/156
See application file for complete search history.

(56) References Cited

U.S. PATENT DOCUMENTS

| 7,417,510 | B2 | 8/2008 | Huang |
| 8,441,291 | B2 | 5/2013 | Hara et al. |
| 8,692,599 | B2 * | 4/2014 | Gong ...................... H03L 7/081 327/156 |
| 8,736,476 | B2 | 5/2014 | Gong et al. |
| 8,791,734 | B1 | 7/2014 | Hara et al. |
| 8,994,420 | B2 | 3/2015 | Eldredge et al. |
| 9,379,880 | B1 | 6/2016 | Xu et al. |
| 9,531,394 | B1 | 12/2016 | Caffee et al. |
| 10,511,315 | B1 * | 12/2019 | Sarda ................... H03K 23/667 |

OTHER PUBLICATIONS

Kratyuk, V., et al., "A Design Procedure for All-Digital Phase-Locked Loops Based on a Charge-Pump Phase-Locked-Loop Analogy," IEEE Transactions on Circuits and Systems—II: Express Briefs, vol. 54, No. 3, Mar. 2007, pp. 247-251.

* cited by examiner

*Primary Examiner* — Anh Q Tra
(74) *Attorney, Agent, or Firm* — Zagorin Cave LLP

(57) ABSTRACT

A clock generator includes an interpolative divider including a phase interpolator and a multi-modulus divider. The interpolative divider is configured to generate an output clock signal based on a clock signal, a control code, and a phase interpolator calibration signal. The clock generator includes a calibration circuit configured to generate the phase interpolator calibration signal based on the clock signal, the output clock signal and a phase interpolator code. The calibration circuit includes a phase-locked loop configured to generate a digital phase error signal based on a reference timestamp signal and a timestamp signal based on the clock signal and the output clock signal. The calibration circuit includes an adaptive loop configured to generate the phase interpolator calibration signal based on the digital phase error signal.

20 Claims, 8 Drawing Sheets

US 10,833,682 B1

CALIBRATION OF AN INTERPOLATIVE DIVIDER USING A VIRTUAL PHASE-LOCKED LOOP

BACKGROUND

Field of the Invention

This invention relates to generating clock signals for electronic devices and more particularly to generating clock signals using interpolative dividers.

Description of the Related Art

A typical clock generator utilizes a phase-locked loop supplied with a reference signal from a source such as a crystal oscillator to generate output clock signals having frequencies consistent with a target application. A technique for generating clock signals having frequencies not rationally related to a frequency of the reference clock signal uses an interpolative divider to divide a high-frequency clock signal by a fractional number. The interpolative divider includes an integer divider, a phase interpolator, and a digital control circuit. Error in the gain of the phase interpolator causes a mismatch between the size of a least-significant bit of the integer divider and the full-scale range of the phase interpolator. Thus, a technique for calibrating the phase interpolator and the integer divider that reduces gain error of the phase interpolator is desired.

SUMMARY OF EMBODIMENTS OF THE INVENTION

In at least one embodiment of the invention, a clock generator includes an interpolative divider including a phase interpolator and a multi-modulus divider. The interpolative divider is configured to generate an output clock signal based on a clock signal, a control code, and a phase interpolator calibration signal. The clock generator includes a calibration circuit configured to generate the phase interpolator calibration signal based on the clock signal, the output clock signal and a phase interpolator code. The calibration circuit includes a phase-locked loop configured to generate a digital phase error signal based on a reference timestamp signal and a timestamp signal based on the clock signal and the output clock signal. The calibration circuit includes an adaptive loop configured to generate the phase interpolator calibration signal based on the digital phase error signal.

In at least one embodiment of the invention, a method includes generating an output clock signal using an interpolative divider responsive to a clock signal, a control code, and a phase interpolator calibration signal. The method includes generating the phase interpolator calibration signal based on the clock signal, the output clock signal, and a phase interpolator code. Generating the phase interpolator calibration signal includes generating a digital phase error signal based on a reference timestamp signal and a timestamp signal based on the clock signal and the output clock signal. Generating the phase interpolator calibration signal includes adapting the phase interpolator calibration signal based on the digital phase error signal.

In at least one embodiment of the invention, a method includes generating an output clock signal based on a clock signal, a control code, and a phase interpolator calibration signal. The method includes generating a digital error signal based on a downsampled version of the output clock signal and an estimated version of the downsampled version of the output clock signal. The method includes generating the phase interpolator calibration signal based on the digital error signal and a phase interpolator control code using a least mean squares filter.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
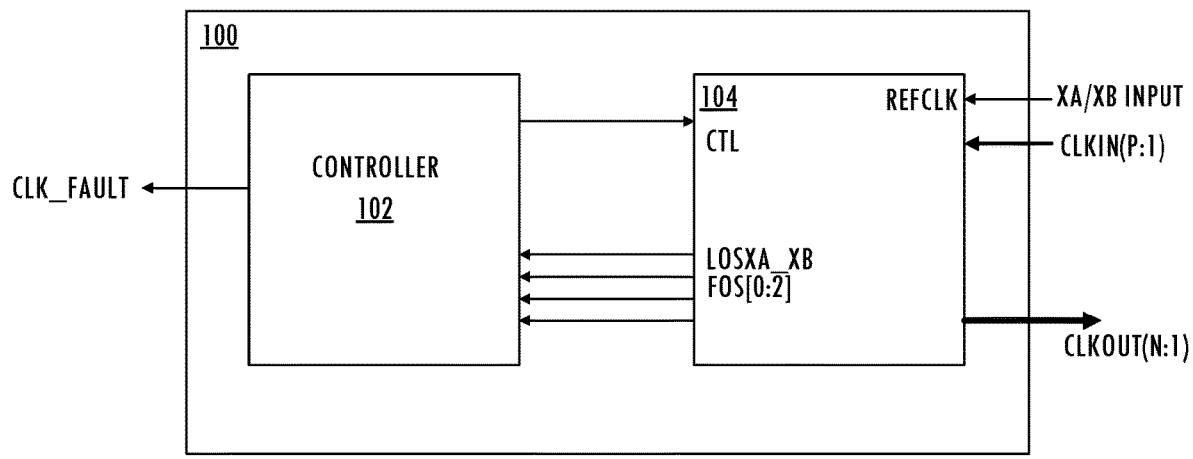
FIG. 1 illustrates a functional block diagram of an exemplary clock product.

Referring to FIG. 1, an embodiment of clock product 100 includes controller 102 and clock generator 104, which monitors at least one received clock signal (e.g., CLKIN(P:1)) using clock signal REFCLK (e.g., a clock signal generated using a crystal oscillator including external crystal 101 coupled to XA/XB input terminal) and provides at least one output clock signal CLKOUT(N:1) and at least one clock quality signal, where P and N are integers greater than zero. In an embodiment of clock product 100, clock signal REFCLK is generated based on a stable source such as crystal oscillator, a microelectromechanical structure (MEMS) oscillator, or other suitable low-jitter source. Controller 102 provides configuration information to clock generator 104 using interface signals CTL. Clock generator 104 provides clock quality information (e.g., LOSXA_XB or CLK_STATUS) to controller 102, which outputs one or more alarm signals (e.g., CLK_FAULT) based on the clock quality information.

Figure 2:
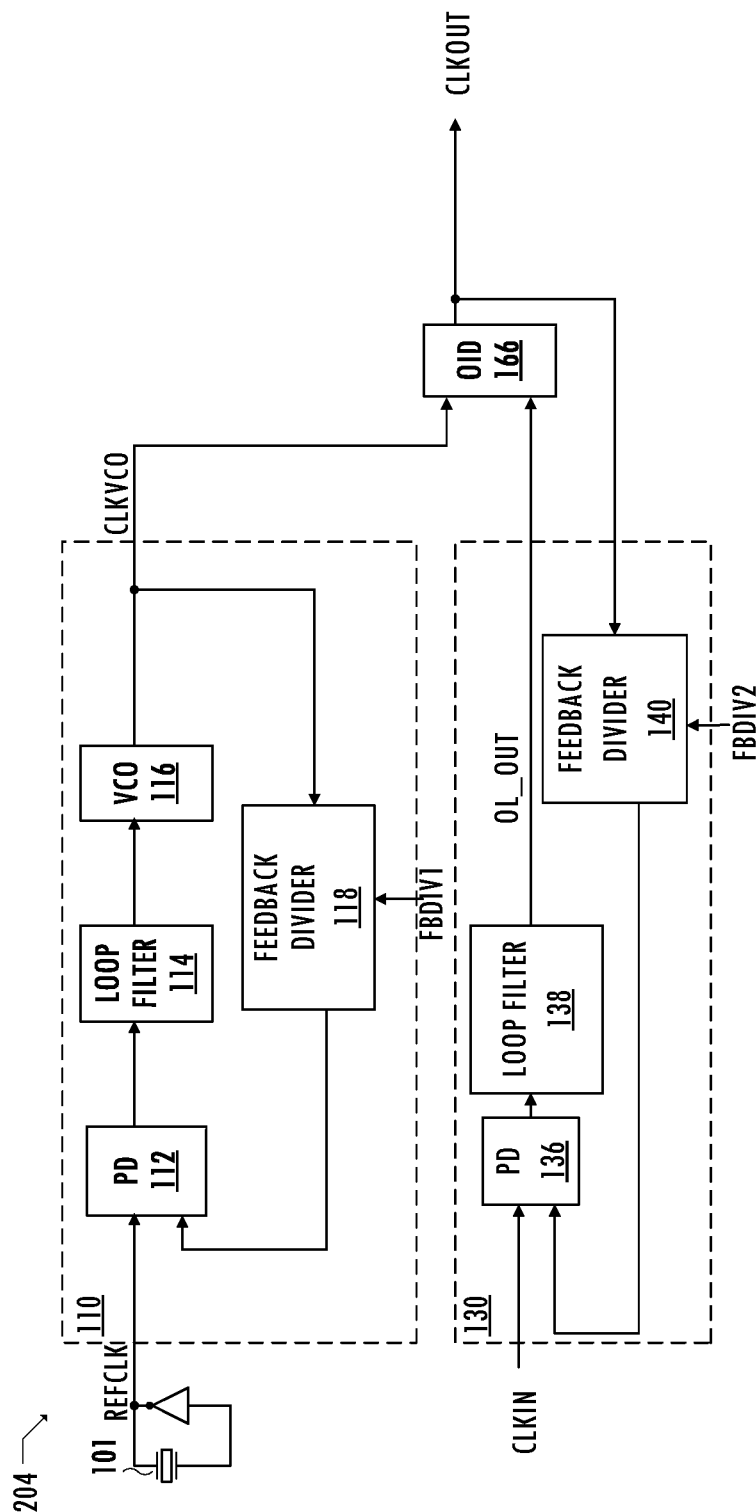
FIG. 2 illustrates a functional block diagram of an exemplary clock generator.

Referring to FIG. 2, clock generator 204 includes phase-locked loop 110, which is used to generate input clock signal CLKVCO based on clock signal REFCLK. Phase-locked loop 110, includes phase/frequency detector 112, which generates a phase difference signal based on the clock signal REFCLK and a feedback signal provided by feedback divider 118. Phase/frequency detector 112 provides the phase difference signal to voltage-controlled oscillator 116 via loop filter 114. Voltage-controlled oscillator 116 may be implemented as a ring oscillator, an LC oscillator, or other suitable oscillator structure. Input clock signal CLKVCO has a frequency based on the frequency of clock signal REFCLK and FBDIV1.

In an embodiment of clock generator 204, phase-locked loop 110 provides clock signal CLKVCO to output interpolative divider 166, which is configured as a digitally controlled oscillator. Output interpolative divider 166 generates output clock signal CLKOUT based on input clock signal CLKVCO and a control signal (e.g., filtered phase difference signal OL_OUT). Outer phase-locked loop 130 generates filtered phase difference signal OL_OUT, which is a control code that output interpolative divider 166 uses as a fractional frequency divider ratio N. Outer phase-locked loop 130 locks to input clock signal CLKIN using phase detector 136, loop filter 138, and feedback divider 140 to generate filtered phase difference signal OL_OUT that is updated at a frequency based on the frequency of input clock signal CLKIN and FBDIV2.

Figure 3:
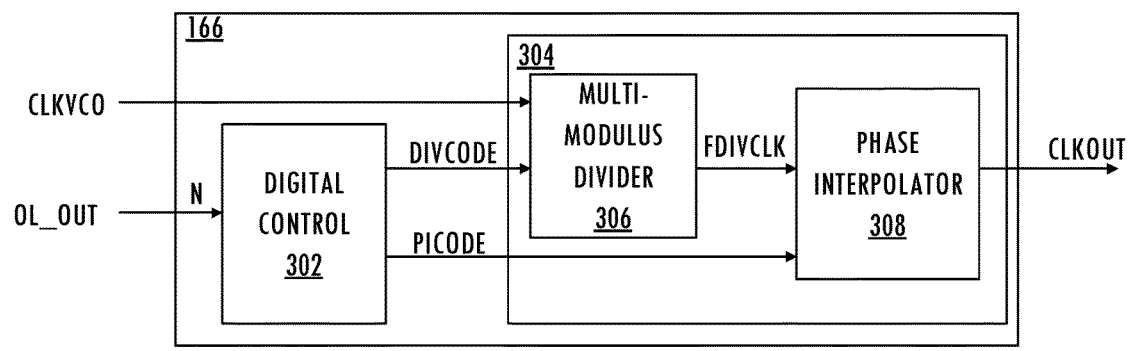
FIG. 3 illustrates a functional block diagram of an exemplary interpolative divider.

FIG. 3 illustrates an exemplary embodiment of output interpolative divider 166. Digital control circuit 302 generates digital control signals for analog circuit 304 of output interpolative divider 166 based on filtered phase difference signal OL_OUT, which may be non-integer. Analog circuit 304 includes multi-modulus divider 306 and phase interpolator 308. Digital control circuit 302 generates sequences of corresponding control codes DIVCODE and PICODE that control multi-modulus divider 306 and phase interpolator 308, respectively. In an embodiment, digital control circuit 302 includes a first order delta signal modulator that generates a stream of integers that approximate a filtered phase difference signal OL_OUT. Thus, digital control circuit 302 provides the integer portion of filtered phase difference signal OL_OUT to multi-modulus divider 306 and supplies the digital quantization error as control code PICODE to phase interpolator 308. In an embodiment, multi-modulus divider 306 is an integer frequency divider that counts down an integer number of corresponding edges of input clock signal CLKVCO, as indicated by digital control code DIVCODE, before generating a corresponding output edge of frequency-divided clock signal FDIVCLK. Phase interpolator 308 interpolates between frequency-divided clock signal FDIVCLK and one or more delayed versions of frequency-divided signal FDIVCLK (e.g., one or more equally spaced phases of frequency-divided clock signal FDIVCLK, equally spaced by an entire period of input clock CLKVCO) based on control code PICODE, which corresponds to the phase error, using techniques that are well known in the art.

In at least one embodiment, phase interpolator 308 delays frequency-divided clock signal FDIVCLK by selecting from 256 equally spaced phases of the frequency-divided clock signal according to the value of control code PICODE. For example, control code PICODE may have F bits (e.g., F=8), corresponding to P=2F (e.g., P=256) different PICODE (e.g., 0≤i≤P-1), which correspond to P different delay values. A maximum delay is introduced by control code PICODE (e.g., $PICODE_{P-1}$) corresponding to a target maximum delay of almost one cycle of input clock signal CLKVCO (e.g., a delay of 255/256×the period of input clock signal CLKVCO). The target delay increment (i.e., a delay difference between consecutive PICODES, e.g., the delay difference between control code $PICODE_i$ and control code $PICODE_{i+1}$, where $0 \le PICODE_i \le PICODE_{P-1}$) is one cycle of input clock signal CLKVCO cycle divided by P. An exemplary interpolative divider is further described in U.S. Pat. No. 7,417,510 filed Oct. 17, 2006, entitled "Direct Digital Interpolative Synthesis," naming Yunteng Huang as inventor, which patent is incorporated herein by reference in its entirety.

In at least one embodiment of phase interpolator 308, target performance is achieved by converting a phase interpolator code to analog phase interpolator control signals using a current digital-to-analog converter. In at least one embodiment, first-order noise-shaping dynamic-element-matching encoding techniques are used to convert control code PICODE, which may be periodic, to a plurality of digital control signals that are provided to analog circuit 304. Analog circuit 304 includes a digital-to-analog converter that converts those control signals to individual analog control signals and provides the analog control signals to current sources in phase interpolator 308.

In an embodiment, phase interpolator 308 generates multiple equally spaced phases of frequency-divided clock signal FDIVCLK and interpolates appropriate ones of those phases to generate output clock signal CLKOUT. Such techniques are well known in the art. Other interpolator implementations may be used based on such factors as the accuracy required, power considerations, design complexity, chip area available, and the number of bits used to represent the digital quantization error.

Figure 4:
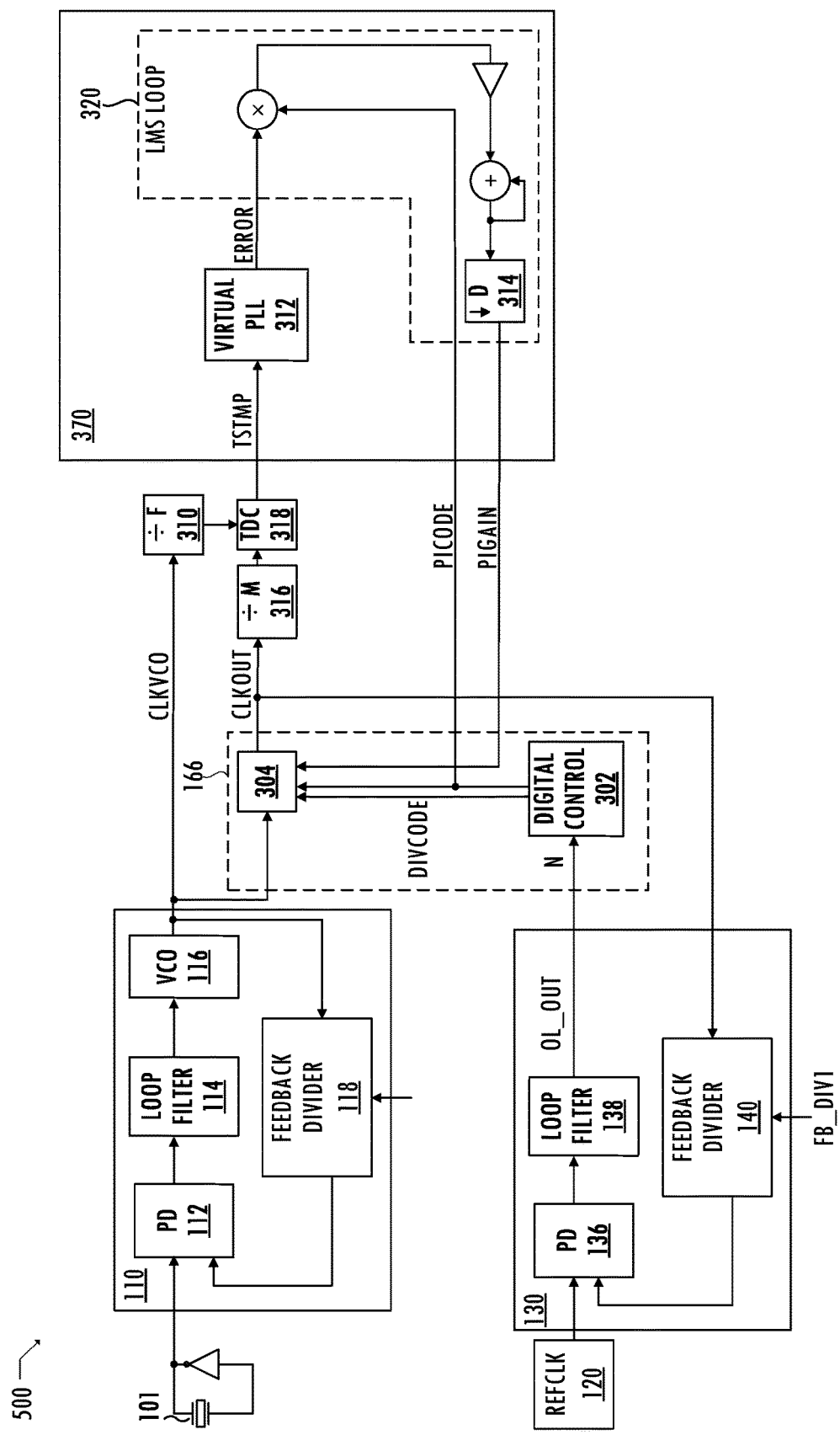
FIG. 4 illustrates a functional block diagram of an exemplary clock generator including an interpolative divider and calibration circuit including a virtual phase-locked loop consistent with at least one embodiment of the invention.

Performance of a clock generator degrades (e.g., output clock signal CLKOUT has phase noise and spurs) if an actual delay resulting from a PICODE-to-delay conversion does not correspond to the target delay for the PICODE-to-delay conversion. Referring to FIG. 4, clock generator 500 implements a calibration technique that reduces or eliminates effects of mismatch between the size of the least-significant bit of the multi-modulus divider and the range of the phase interpolator to reduce phase noise and spurs in output clock signal CLKOUT. This calibration technique digitizes a time corresponding to an edge of the down-sampled output clock signal CLKOUT to generate digital time codes (e.g., timestamps) TSTMP.

In at least one embodiment, time-to-digital converter 318 produces digital time codes representing the time of the edge referred to a reference clock signal (e.g., generated by fractional-divider 310 based on input clock signal CLKVCO) derived from the same source as the output interpolative divider, although other embodiments use a different reference clock signal to generate digital time codes. Time-to-digital converter 318 provides the timestamp signal to virtual phase-locked loop 312 in calibration circuit 370. Calibration circuit 370 includes virtual phase-locked loop 312 (i.e., a digital phase-locked loop) that produces a reference signal and uses that reference signal to generate a phase error signal. Calibration circuit 370 includes least mean squares loop 320, which is an adaptive loop that uses the phase error signal to generate calibration control code PIGAIN.

Figure 5:
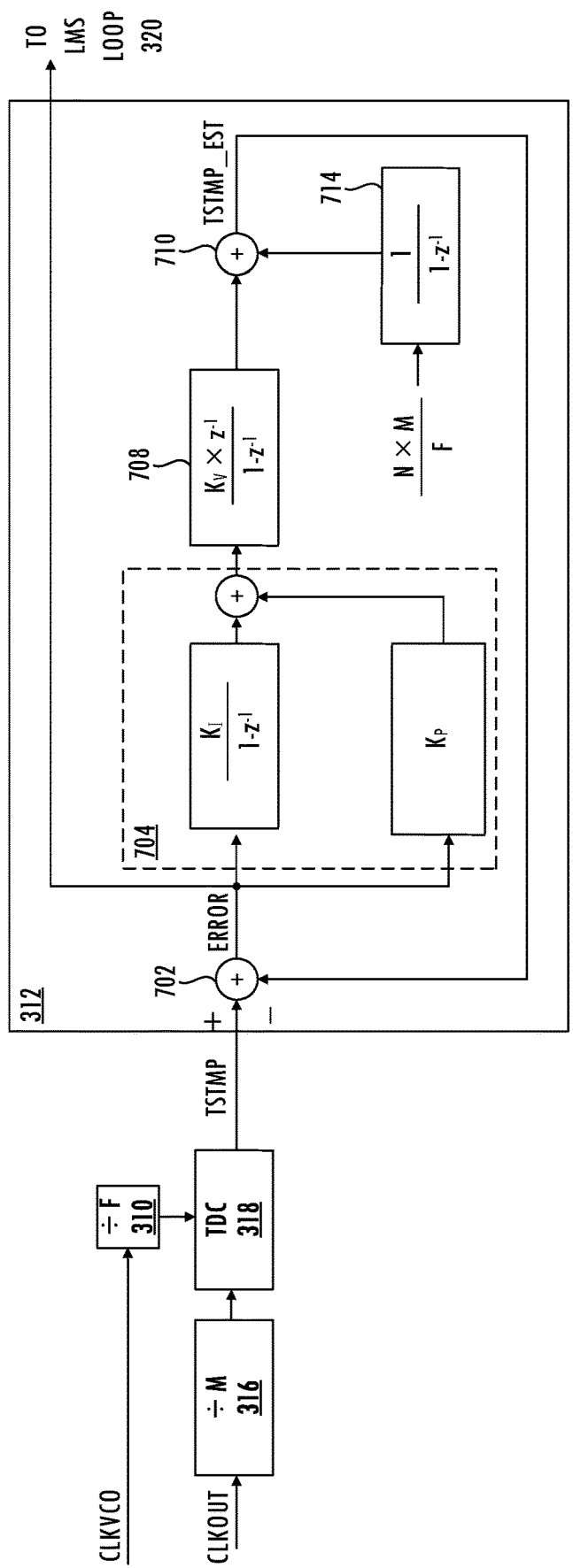
FIG. 5 illustrates a functional block diagram of a portion of an exemplary clock generator including an interpolative divider and calibration circuit consistent with at least one embodiment of the invention.

Referring to FIG. 5, virtual phase-locked loop 312 estimates digital time signal TSTMP_EST that is a feedback reference signal that is free from spurs. Virtual phase-locked loop 312 uses that feedback reference signal to generate digital phase error signal ERROR. Virtual phase-locked loop 312 provides digital phase error signal ERROR to least mean squares loop 320. Least mean squares loop 320 correlates digital phase error signal ERROR to control code PICODE. Least mean squares loop 320 adapts (i.e., adjusts)

calibration control code PIGAIN until the error is zero. In at least one embodiment, analog output interpolative divider 340 includes a phase interpolator that adjusts the phase interpolator gain according to calibration control code PIGAIN. In at least one embodiment of clock generator 500, a digital-to-analog converter generates a calibration current according to calibration control code PIGAIN and that may be combined with currents generated by a phase interpolator based on control code PICODE. In at least one embodiment, output interpolative divider 166 adjusts the control codes provided to the phase interpolator until the gain error is zero. Any suitable gain adjustment technique may be used. In at least one embodiment of clock generator 500, the frequency of input clock signal CLKVCO is much greater than (i.e., at least one order of magnitude greater than) the frequency of output clock signal CLKOUT. For example, input clock signal CLKVCO has a frequency of 13 GHz, output clock signal CLKOUT has a frequency of 100 MHz, control code PICODE has a resolution of 300 femto-seconds, and calibration control code PIGAIN corresponds to a delay in femto-seconds.

Figure 6:
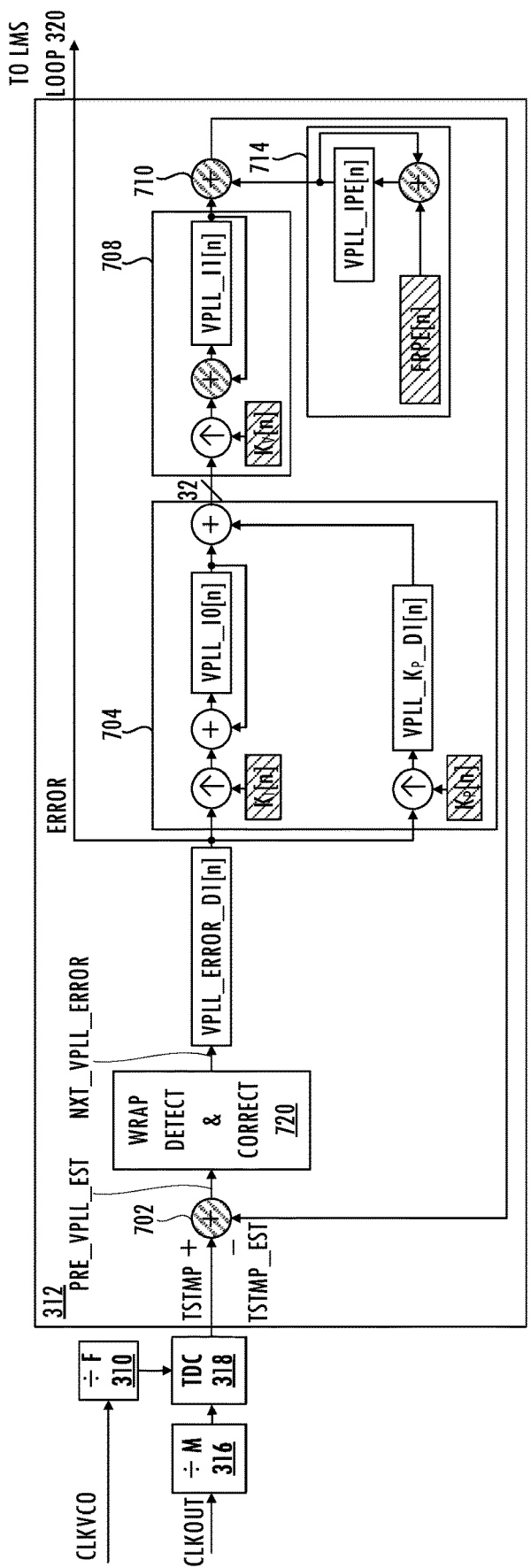
FIG. 6 illustrates a detailed functional block diagram of a portion of an exemplary clock generator including an interpolative divider and calibration circuit consistent with at least one embodiment of the invention.

Referring to FIGS. 4-6, in at least one embodiment, virtual phase-locked loop 312 includes a digital phase detector that receives digital time codes and provides digital time error codes. Virtual phase-locked loop 312 is a type-II digital phase-locked loop including split proportional and integral paths. Virtual phase-locked loop 312 operates at a clock rate of the downsampled output clock signal CLKOUT (e.g., operates at a clock rate of 6 MHz, or other rate less than 100 MHz). Virtual phase-locked loop 312 updates when new values of digital time code TSTMP become available. A z-domain representation of an exemplary virtual phase-locked loop 312 includes digital phase detector 702 (e.g., a digital summing circuit).

Figure 7:
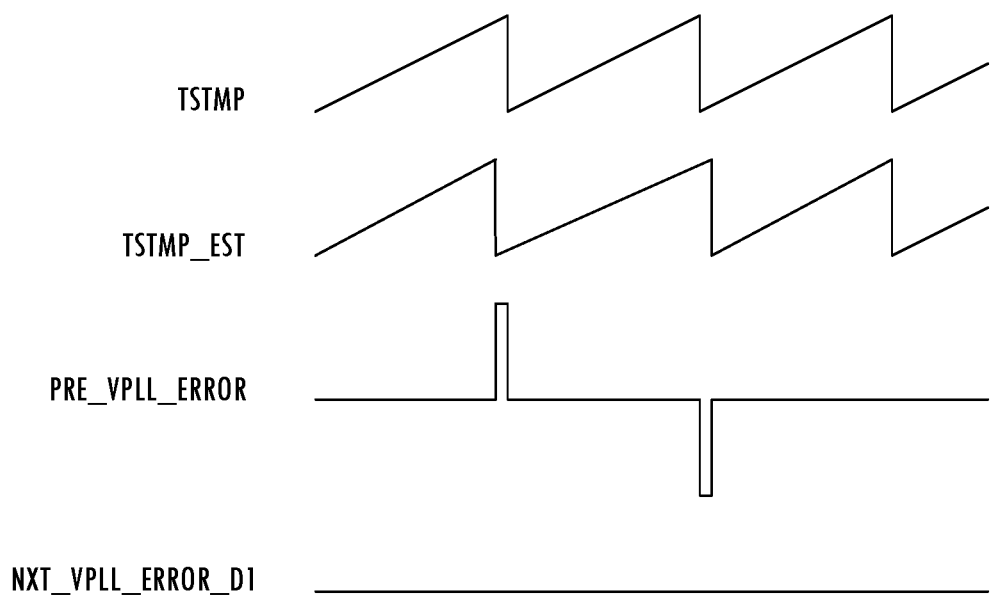
FIG. 7 illustrates exemplary waveforms for a calibration circuit consistent with at least one embodiment of the invention.

In at least one embodiment, virtual phase-locked loop 312 has a datapath size of 32 bits, where 8 bits are integer bits and 24 bits are fractional bits. The binary point is aligned with the binary point of time-to-digital converter 318. Hatched summing circuits (e.g., circuit 710) are non-saturating summing circuits that facilitate processing less than all bits of digital time code TSTMP. Virtual phase-locked loop 312 uses only 19 of 44 bits received from time-to-digital converter 318 and ignores additional integer bits (e.g., most-significant bits). The digital value received by virtual phase-locked loop 312 wraps around. Virtual phase-locked loop 312 computations generate extra datapath fractional bits (e.g., least-significant bits). The portion of the digital time codes received by digital phase detector 702 and provided by virtual phase-locked loop 312 wrap (i.e., repeat or roll over) over time. Referring to FIGS. 4, 6, and 7, when the wrap events are not aligned (e.g., the rollover of digital time code TSTMP and the rollover of estimated digital time code TSTMP_EST are not aligned), then virtual phase-locked loop 312 produces a large error signal (e.g., a pulse in digital phase error signal PRE_VPLL_ERROR). In at least one embodiment, wrap detection and correction circuit 720 compensates for the wrapping error in digital phase error signal PRE_VPLL_EST and generates corrected digital phase error signal NXT_VPLL_ERROR, which is stored in state register VPLL_ERROR_D1[n]. For example, wrap detection and correction circuit 720 compares digital phase error signal PRE_VPLL_ERROR to a prior value of digital phase error signal PRE_VPLL_ERROR. If the current value substantially exceeds the prior value (e.g., by a predetermined amount), then wrap detection and correction circuit 720 compensates the value of digital phase error signal PRE_VPLL_ERROR and provides that compensated value as digital phase error signal NXT_VPLL_ERROR. Otherwise, wrap detection and correction circuit 720 provides digital phase error signal PRE_VPLL_ERROR as digital phase error signal NXT_VPLL_ERROR.

Virtual phase-locked loop 312 includes digital loop filter 704 having a proportional loop filter gain $K_P$ (which is stored in a corresponding register $K_P[n]$) and an integral loop filter having gain $K_I$ (which is stored in a corresponding register $K_I[n]$) and a z-domain representation:

$$\frac{K_I}{1-z^{-1}}.$$

The output of digital loop filter 704 drives digitally controlled oscillator 708, which has gain $K_V$ (which is stored in a corresponding register $K_V[n]$) and a z-domain representation:

$$\frac{K_V \times z^{-1}}{1-z^{-1}}.$$

Integrator 714 has a z-domain representation:

$$\frac{1}{1-z^{-1}},$$

and is programmed with a free-running period estimate to generate expected timecodes with the same period as digital time code TSTMP based on edges of the downsampled version of output clock signal CLKOUT (e.g., output of frequency divider 316). In at least one embodiment, the free-running period estimate is:

$$\frac{N \times M}{F},$$

where N is the divide ratio of the interpolative divider, e.g., filtered phase difference signal OL_OUT provided to output interpolative divider 166. In at least one embodiment of virtual phase-locked loop 312, register FRPE[n] stores that predetermined value to reduce computational requirements. The target period of digital time code TSTMP is known since the frequency configuration of the output interpolative divider 166 is known. Instead of using that frequency configuration information, the free-running period estimate may be generated by taking the difference of the first two values of digital time code TSTMP.

Circuit 710 generates a predicted next time code, estimated digital time code TSTMP_EST, in response to capturing a value of the free-running oscillator signals using the output of digitally controlled oscillator 708. Virtual phase-locked loop 312 provides the phase error signal ERROR to least mean squares loop 320. Least mean squares loop 320 multiplies control code PICODE by phase error signal ERROR and accumulates the gained product. Decimator 314 downsamples the accumulated, gained product (e.g., by a factor of 128) and provides the decimated signal as calibration control code PIGAIN. In at least one embodiment, virtual phase-locked loop 312, the wrapping frequency of intermediate signals within virtual phase-locked loop 312 increases with the reduction in the number of integer bits used.

Circuit 710 combines the output of digitally controlled oscillator 708 and an ideal period estimate to generate timestamp estimate TSTMP_EST (i.e., an estimated digital clock signal) that is fed back to digital phase detector 702. In at least one embodiment of virtual phase-locked loop 312, when a control circuit first enables virtual phase-locked loop 312, the control circuit also initializes integrator 714 with the first value of digital time code TSTMP to produce approximate phase alignment. Virtual phase-locked loop 312 is given time to lock. Then, the control circuit enables least mean squares loop 320 for an amount of time required to converge to the correct value. The control circuit configures least mean squares loop 320 with a high gain for fast adaptation but decreases the gain during calibration to reduce noise. Then, virtual phase-locked loop 312 corrects for rounding errors in the free-running period estimate calculation or tracks changes in the frequency configuration of the output interpolative divider 166. In some embodiments, gains in virtual phase-locked loop 312 are stored in registers (shaded rectangles in FIG. 6) and are programmable for flexible bandwidth and zero locations. The type-II topology of virtual phase-locked loop 312 causes the average of error signal VPLL_ERROR_D1[n] to be zero. Accordingly, least mean squares loop 320 does not introduce adaptation bias. A control circuit configures the least mean squares loop 320 with low gain to average out quantization error in input time code TSTMP over the entire range of the phase interpolator.

Calibration can be done in either a foreground or a background mode. A control circuit selects the down-sampling ratio and virtual phase-locked loop bandwidth for proper operation of the calibration loop in a foreground mode of operation. In embodiments of digital control circuit 302 that control multi-modulus divider 306 using a first-order delta-sigma modulator, control code PICODE received by phase interpolator 308 is a sawtooth wave, which may appear otherwise due to aliasing. Thus, any gain error also appears as a corresponding sawtooth wave based on digital time code TSTMP. For proper calibration, virtual phase-locked loop 312 has a bandwidth that is less than the fundamental frequency of this sawtooth wave to ensure that virtual phase-locked loop 312 does not track the gain error. The fundamental frequency of the error can be controlled by setting the fractional part, x, of the interpolative divider frequency and the down-sampling ratio M. Down-sampling ratio M is set to control the frequency of the output of frequency divider 316 to be within the functional range of time-to digital converter 318. The frequency of the output of frequency divider 316 also sets the reference rate of virtual phase-locked loop 312 and the update rate of least mean squares loop 320 and therefore determines the time required for calibration. Setting $x=N/2^B/M$, where N is odd and near $2^{B-1}$, and B is the number of bits of resolution of phase interpolator 308 (e.g., B=8), sets the fundamental frequency of the sawtooth wave to be relatively high. Accordingly, the bandwidth of virtual phase-locked loop 312 is set relatively high for fast settling and to guarantee that the least mean squares loop 320 receives a value in the range of control code PICODE.

Figure 8:
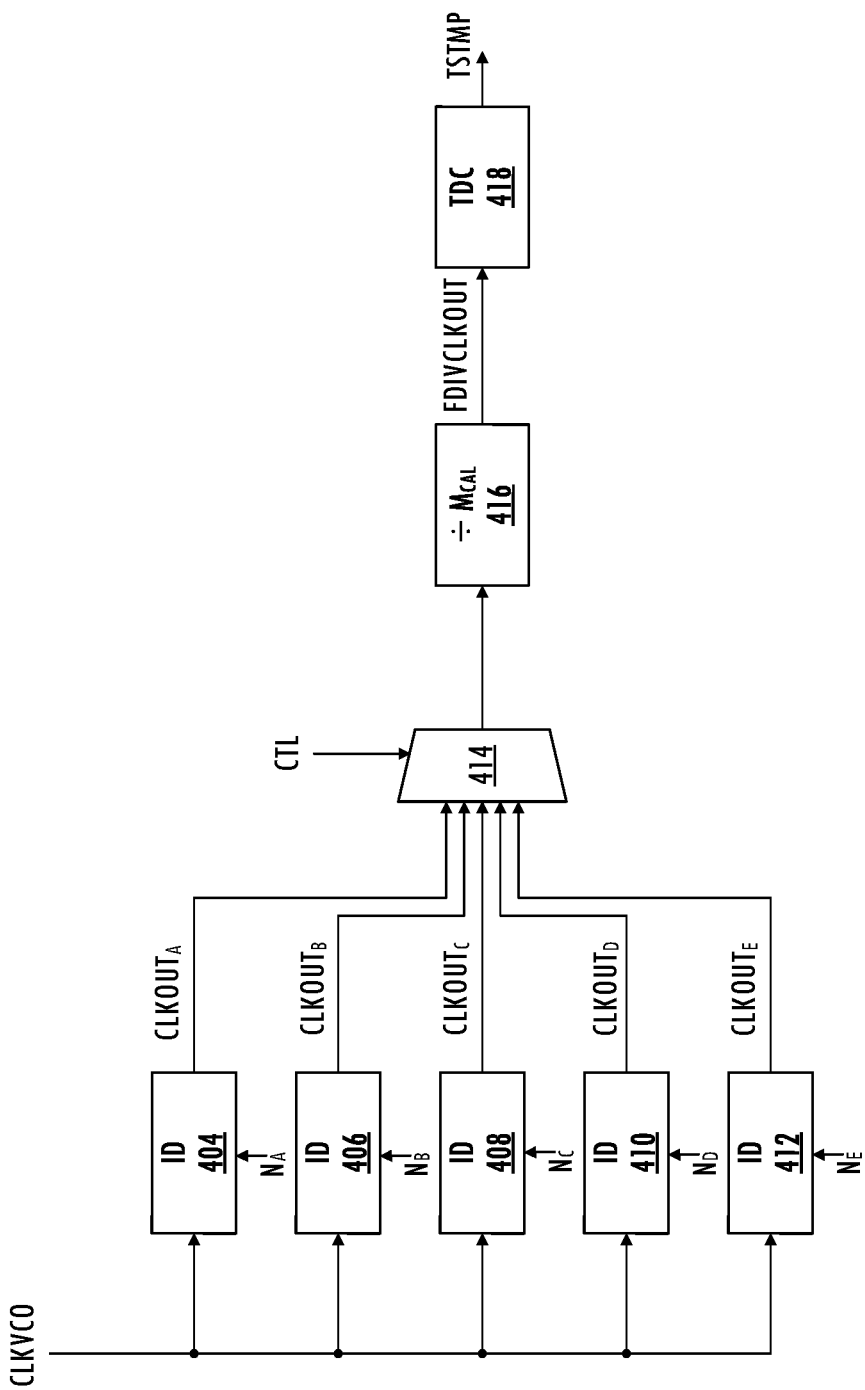
FIG. 8 illustrates a functional block diagram of a portion of an exemplary clock generator including multiple output interpolative dividers and a shared calibration circuit consistent with at least one embodiment of the invention.
Figure 9:
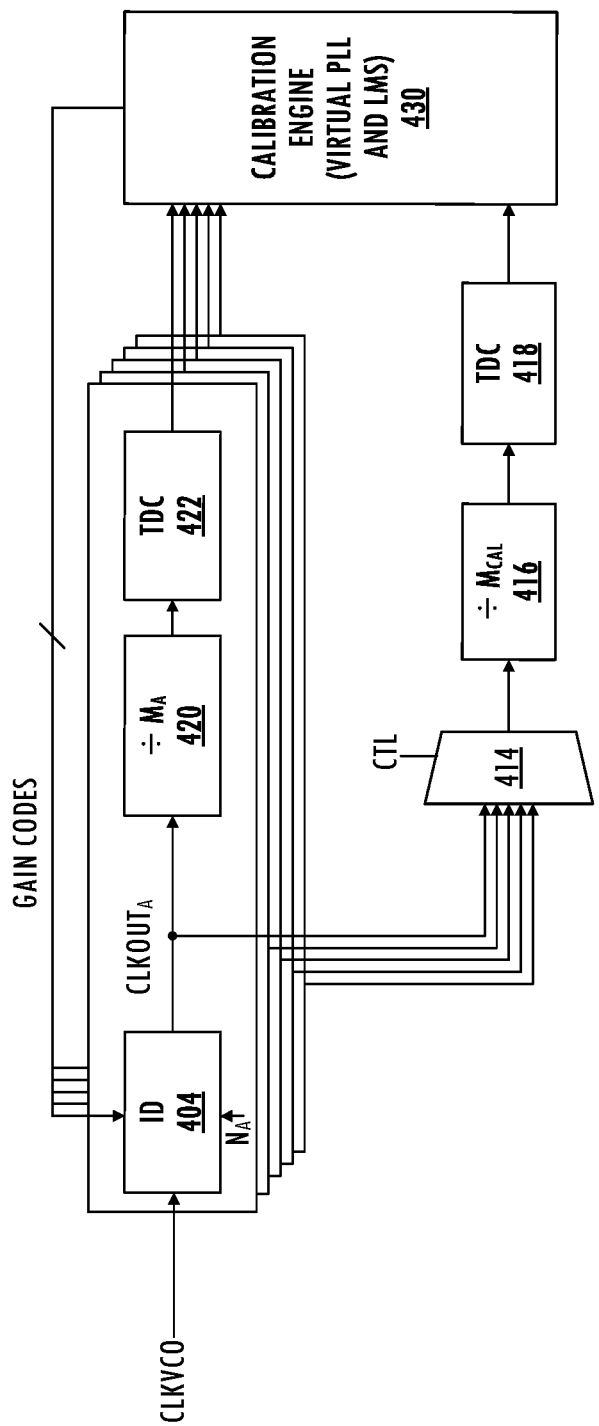
FIG. 9 illustrates a functional block diagram of a portion of an exemplary clock generator including multiple output interpolative dividers and a shared calibration circuit consistent with at least one embodiment of the invention.

In at least one embodiment of a clock product, digital time code TSTMP has a data rate that is slow enough to allow calibration circuit 370 to serially process data for multiple output interpolative dividers that separately store state variables. In at least one embodiment of clock generator 500, frequency divider 316 and time-to-digital converter 318 are circuits dedicated to foreground calibration of an output interpolative divider. However, in other embodiments of clock generator 500, frequency divider 316 and time-to-digital converter 318 are reused or time-division multiplexed between calibration and other system functions. Referring to FIGS. 4, 8, and 9, in at least one embodiment of a clock generator, frequency divider 416 and time-to-digital converter 418 may not be usable for foreground calibration based on the frequency plan. Accordingly, frequency divider 416 and time-to-digital converter 418 are included and shared by interpolative dividers 404, 406, 408, 410, and 412, that are calibrated sequentially or in a round-robin fashion to achieve calibration as a background process. A controller executes firmware that sets control code $M_{CAL}$ based on the divide ratio in use (e.g., $N_A$, $N_B$, $N_C$, $N_D$, or $N_E$) and generates control signal CTL that causes select circuit 414 to provide a selected output clock signal $CLKOUT_n$ and associated state variables to frequency divider 416, time-to-digital converter 418, and calibration circuit 430.

After initialization and during normal operation, a virtual phase-locked loop and a least mean squares loop of calibration circuit 430 operate in a background mode according to a target frequency plan. Background calibration can be initiated periodically at a rate fast enough to track changes in operating conditions and temperature. The fractional part, x, of the interpolative divide ratio is observed, and $M_{CAL}$ is programmed to be one of two prime divide ratios to set the input frequency of the signal provided to time-to-digital converter 418 near a target frequency. The first prime divide ratio is checked to guarantee that $x \times M_{CAL}$ is sufficiently far away from an integer (as determined by the bandwidth of virtual phase-locked loop 312). If not, the second prime divide ratio is checked. The prime divide ratios are chosen such that if neither product is far enough away from an integer, then x is so close to an integer that the virtual phase-locked loop will track it and prevent good calibration. For example, for two output interpolative dividers, a control circuit or firmware executing on a controller sets $M_{CAL}$ based on the interpolative divider ratio in use. It uses one of two possible prime values $M_1$ and $M_2$. One may be degenerate, e.g., if $N=k/M_1$. If the effective divide ratio with both $M_1$ and $M_2$ are near integer, then N itself is near integer and calibration is skipped. Note that if N is an integer, then no calibration is needed.

Referring to FIG. 4, in at least one embodiment of clock generator 500, virtual phase-locked loop 312 is used to achieve other types of calibration or other signal processing goals. For example, the calibration could be extended to calibrate the nonlinearity of a phase interpolator in analog circuit 304. In at least one embodiment, calibration circuit 370 is coupled between time-to-digital converter 318 and a digital-to-time converter (e.g., an interpolative divider in a feedback loop of a phase-locked loop) to reduce or eliminate jitter.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative and is not intended to limit the scope of the invention as set forth in the following claims. For example, while the invention has been described in an embodiment in which a least mean squares loop is used, one of skill in the art will appreciate that the teachings herein can be utilized with other adaptive loops. The terms "first," "second," "third," and so forth, as used in the claims, unless otherwise clear by context, is to distinguish between different items in the claims and does not otherwise indicate or imply any order in time, location or quality. Variations and modifications of the embodiments disclosed herein may be made based on the description set forth herein, without departing from the scope of the invention as set forth in the following claims.

What is claimed is:

1. A clock generator comprising:
   an interpolative divider comprising a phase interpolator and a multi-modulus divider, the interpolative divider being configured to generate an output clock signal based on a clock signal, a control code, and a phase interpolator calibration signal; and
   a calibration circuit configured to generate the phase interpolator calibration signal based on the clock signal, the output clock signal and a phase interpolator code, wherein the calibration circuit comprises:
      a phase-locked loop configured to generate a digital phase error signal based on a reference timestamp signal and a timestamp signal based on the clock signal and the output clock signal; and
      an adaptive loop configured to generate the phase interpolator calibration signal based on the digital phase error signal.

2. The clock generator, as recited in claim 1, further comprising:
   an integer frequency divider configured to generate a frequency-divided output clock signal in response to the output clock signal and an integer code; and
   a time-to-digital converter configured to generate the timestamp signal, the timestamp signal including digital codes corresponding to edges of a frequency-divided clock signal based on the clock signal.

3. The clock generator, as recited in claim 1, wherein the phase-locked loop includes two integrators and is configured to cause the digital phase error signal to have zero mean.

4. The clock generator, as recited in claim 1, wherein the phase-locked loop comprises an integrator programmed with a free-running period estimate to generate the reference timestamp signal with the same period as the timestamp signal.

5. The clock generator, as recited in claim 1, wherein the reference timestamp signal is a spur-attenuated version of the timestamp signal.

6. The clock generator, as recited in claim 1, wherein the phase-locked loop further comprises:
   a wrap detection and correction circuit configured to compensate for rollover error caused by using less than all bits of the timestamp signal by the phase-locked loop and the adaptive loop.

7. The clock generator, as recited in claim 1, further comprising:
   a first frequency divider configured to generate an integer-divided output clock signal;
   a second frequency divider configured to provide an integer-divided clock signal; and
   a time-to-digital converter configured to generate the timestamp signal based on the integer-divided output clock signal and the integer-divided clock signal.

8. The clock generator, as recited in claim 1, wherein the digital phase error signal is a difference between the reference timestamp signal and the timestamp signal.

9. The clock generator, as recited in claim 1, wherein the adaptive loop includes a least mean squares filter.

10. The clock generator, as recited in claim 1, wherein the phase-locked loop comprises:
    a digital circuit configured to compute a difference between the timestamp signal and the reference timestamp signal to generate the digital phase error signal;
    a first integrator configured to generate an integrated phase error signal based on the digital phase error signal;
    a proportional circuit path configured to generate a proportional phase error signal based on the digital phase error signal;
    a second digital circuit configured to compute a sum of the integrated phase error signal and the proportional phase error signal;
    a second integrator responsive to the sum;
    a free running period estimator circuit configured to generate an expected timestamp signal; and
    a third digital circuit configured to generate the reference timestamp signal based on the sum of the expected timestamp signal and an output of the second integrator.

11. The clock generator, as recited in claim 1, further comprising:
    a select circuit configured to selectively output an active output clock signal generated by one of a plurality of output interpolative dividers;
    a shared integer frequency divider configured to generate a frequency-divided active clock signal in response to the active output clock signal and a corresponding integer code; and
    a shared time-to-digital converter configured to generate a corresponding timestamp signal based on edges of the frequency-divided active clock signal,
    wherein the calibration circuit is further configured to generate an active phase interpolator calibration signal based on the clock signal, the active output clock signal, and a corresponding phase interpolator code, the active phase interpolator calibration signal being used to periodically update the phase interpolator calibration signal.

12. A method comprising:
    generating an output clock signal using an interpolative divider responsive to a clock signal, a control code, and a phase interpolator calibration signal; and
    generating the phase interpolator calibration signal based on the clock signal, the output clock signal, and a phase interpolator code, wherein
       generating the phase interpolator calibration signal comprises:
       generating a digital phase error signal based on a reference timestamp signal and a timestamp signal based on the clock signal and the output clock signal; and
       adapting the phase interpolator calibration signal based on the digital phase error signal.

13. The method, as recited in claim 12, further comprising:

generating a frequency-divided output clock signal in response to the output clock signal and an integer code; and generating the timestamp signal, the timestamp signal including digital codes corresponding to edges of the frequency-divided output clock signal based on the clock signal.

14. The method, as recited in claim 12, further comprising:

generating a divider control code and phase interpolator control code based on the control code; and controlling a phase interpolator circuit based on a combination of the phase interpolator calibration signal and the phase interpolator control code.

15. The method, as recited in claim 12, wherein the digital phase error signal has zero mean.

16. The method, as recited in claim 12, further comprising:

generating the reference timestamp signal with the same period as the timestamp signal.

17. The method, as recited in claim 12, further comprising:

generating an integer-divided output clock signal;

generating an integer-divided clock signal; and generating the timestamp signal based on the integer-divided output clock signal and the integer-divided clock signal.

18. The method, as recited in claim 12, further comprising:

selectively providing an active output clock signal generated by one of a plurality of output interpolative dividers;

generating a frequency-divided active clock signal in response to the active output clock signal and a corresponding integer code;

generating a corresponding timestamp signal based on edges of the frequency-divided active clock signal; and periodically updating an active phase interpolator calibration signal based on the clock signal, the active output clock signal, and a corresponding phase interpolator code.

19. The method, as recited in claim 18, wherein the selectively providing is round-robin selection of the active output clock signal from the plurality of output interpolative dividers.

20. A method comprising:

generating an output clock signal based on a clock signal, a control code, and a phase interpolator calibration signal;

generating a digital error signal based on a downsampled version of the output clock signal and an estimated version of the downsampled version of the output clock signal; and generating the phase interpolator calibration signal based on the digital error signal and a phase interpolator control code using a least mean squares filter.

* * * * *